US012787611B2

United States Patent
(12) United States Patent
Lazo Martinez et al.

(10) Patent No.: US 12,787,611 B2
(45) Date of Patent: Nov. 3, 2026

(54) DISPLAY APPARATUS

(71) Applicant: Samsung Display Co., Ltd., Yongin-si (KR)

(72) Inventors: Israel Esteban Lazo Martinez, Yongin-si (KR); Hyungguen Yoon, Yongin-si (KR); Sukhoon Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 351 days.

(21) Appl. No.: 18/415,944

(22) Filed: Jan. 18, 2024

(65) Prior Publication Data

US 2024/0251642 A1 Jul. 25, 2024

(30) Foreign Application Priority Data

Jan. 20, 2023 (KR) ........................ 10-2023-0009028

(51) Int. Cl.

*H10K 59/80* (2023.01)
*H10K 59/122* (2023.01)
*H10K 59/38* (2023.01)

(52) U.S. Cl.

CPC ......... *H10K 59/877* (2023.02); *H10K 59/122* (2023.02); *H10K 59/38* (2023.02)

(58) Field of Classification Search

CPC ........................... H10K 59/122; H10K 59/173
See application file for complete search history.

(56) References Cited

U.S. PATENT DOCUMENTS

2014/0168572 A1 6/2014 Iwata et al.
2017/0141167 A1* 5/2017 Naganuma ........... H10K 59/131
2022/0052119 A1* 2/2022 Yoon ....................... H10K 59/38
2022/0285465 A1* 9/2022 Kang .................... H10W 90/00

FOREIGN PATENT DOCUMENTS

JP 2014199267 A 10/2014
KR 10-2018-0068076 6/2018
KR 10-2021-0080924 7/2021
KR 10-2021-0153191 12/2021

OTHER PUBLICATIONS

Ye et al., "Sharp selective scattering of red, green, and blue light achieved via gain material's loss compensation", Optics Express, Mar. 18, 2019, pp. 9189-9204, vol. 27, No. 6.

* cited by examiner

*Primary Examiner* — Christine S. Kim
*Assistant Examiner* — Cole Leon Lindsey
(74) *Attorney, Agent, or Firm* — CANTOR COLBURN LLP

(57) ABSTRACT

A display apparatus includes multiple light-emitting devices are disposed on a substrate, multiple color conversion layers disposed on the substrate and corresponding to the light-emitting devices, and multiple banks disposed between adjacent ones of the color conversion layers. Each of the banks includes first scattering particles, second scattering particles, and a polymer host. A refractive index ($n_1$) of the first scattering particles is greater than a refractive index ($n_0$) of the polymer host. The refractive index ($n_1$) of the first scattering particles and a refractive index ($n_2$) of the second scattering particles are different.

20 Claims, 6 Drawing Sheets

DISPLAY APPARATUS

CROSS REFERENCE TO RELATED APPLICATION(S)

This application claims priority to and benefits of Korean Patent Application No. 10-2023-0009028 under 35 U.S.C. § 119, filed on Jan. 20, 2023, in the Korean Intellectual Property Office (KIPO), the entire contents of which are incorporated herein by reference.

BACKGROUND

1. Technical Field

Embodiments relate to a display apparatus.

2. Description of the Related Art

Display apparatuses are apparatuses that visually display data such as an image. Such a display apparatus includes a substrate partitioned into a display area and a peripheral area. In the display area, scan lines and data lines are formed to be insulated from each other, and multiple pixels are provided (and included in the display apparatus). A thin film transistor corresponding to each of the pixels and a pixel electrode electrically connected to the thin film transistor are provided in the display area. A counter electrode commonly provided in the pixels may be provided in the display area. Various lines, a scan driver, a data driver, a controller, a pad part, and the like may be provided in the peripheral area to transmit electrical signals to the display area.

The use of such display apparatuses has diversified. Accordingly, various designs have been attempted to improve the quality of display apparatuses.

SUMMARY

The disclosure provides a display apparatus that can clearly implement colors of light emitted from each of pixels.

The disclosure also provides a display device with improved light extraction efficiency.

However, the objects are not limited thereto and should not be used to limit the scope of the disclosure. Additional aspects will be set forth in part in the description which follows and, in part, will be apparent from the description, or may be learned by practice of the embodiments of the disclosure.

According to an embodiment, a display apparatus may include a plurality of light-emitting devices disposed on a substrate, a plurality of color conversion layers disposed on the substrate and corresponding to the plurality of light-emitting devices, and a plurality of banks disposed between adjacent ones of the plurality of color conversion layers. Each of the plurality of banks may include first scattering particles, second scattering particles, and a polymer host. A refractive index ($n_1$) of the first scattering particles may be greater than a refractive index ($n_0$) of the polymer host. The refractive index ($n_1$) of the first scattering particles and a refractive index ($n_2$) of the second scattering particles may be different.

In an embodiment, the refractive index ($n_1$) of the first scattering particles and the refractive index ($n_0$) of the polymer host may satisfy Condition 1 below.

$$|n_1 - n_0| > 0.8 \quad \text{[Condition 1]}$$

The first scattering particles and the polymer host may be selected to satisfy Condition 1 so that scattering and/or reflecting of visible light can be increased in the bank including the first scattering particles. As a result, the light efficiency of the display apparatus including the bank may be increased.

In an embodiment, the refractive index ($n_2$) of the second scattering particles may be less than the refractive index ($n_0$) of the polymer host.

In an embodiment, the refractive index ($n_2$) of the second scattering particles may be less than or equal to about 1.5.

In an embodiment, the refractive index ($n_2$) of the second scattering particles may be less than or equal to about 1.0.

In case that the refractive index ($n_2$) of the second scattering particles satisfies the above value, the transmittance of the bank including the second scattering particles with respect to light having a wavelength of less than or equal to about 400 nm may be increased. As a result, an undercut phenomenon caused by ultraviolet light may be suppressed. The transmittance of the bank including the second scattering particles with respect to light having a wavelength of greater than or equal to about 800 nm may be improved. As a result, a recognition rate of a mask align key used to form a pattern may be improved. Accordingly, a pattern of the bank may be precisely and densely formed.

In an embodiment, the refractive index ($n_2$) of the second scattering particles and the refractive index ($n_0$) of the polymer host may satisfy Condition 2 below.

$$|n_2 - n_0| \leq 0.6 \quad \text{[Condition 2]}$$

In case that the refractive index ($n_2$) of the second scattering particles satisfies Condition 2 above, the transmittance of the bank including the second scattering particles with respect to light having a wavelength of less than or equal to about 400 nm may be increased. As a result, an undercut phenomenon caused by ultraviolet light may be further suppressed. The transmittance of the bank including the second scattering particles with respect to light having a wavelength of greater than or equal to about 800 nm may be further improved. As a result, a recognition rate of a mask align key used to form a pattern may be further improved. Accordingly, the pattern of the bank may be more precisely and densely formed.

The second scattering particles may be used together with the first scattering particles. In case that the second scattering particles satisfy a refractive index of Condition 2, an increase in concentration of scattering particles and maintenance of a recognition rate of a mask align key may be harmoniously pursued. As a result, the pattern of the bank may be more densely formed, and the visibility of the bank may be suppressed. At the same time, the light efficiency of the display apparatus including the bank may be improved.

In an embodiment, the first scattering particles may be comprised in less than or equal to about 5 wt % of each of the plurality of banks.

In an embodiment, the first scattering particles may be comprised in less than or equal to about 2 wt % of each of the plurality of banks. The first scattering particles may be comprised in greater than or equal to about 1 wt % of each of the plurality of banks.

In an embodiment, the second scattering particles may be comprised in greater than or equal to about 10 wt % of each of the plurality of banks.

In an embodiment, the second scattering particles may be comprised in greater than or equal to about 20 wt % of each of the plurality of banks.

In an embodiment, the second scattering particles may be comprised in less than or equal to about 50 wt % of each of the plurality of banks.

In case that the first scattering particles and the second scattering particles satisfy the above numerical ranges, the first scattering particles and the second scattering particles may be comprised in greater than or equal to about 11 wt % of each of the plurality of banks. In case that the scattering particles satisfies the numerical range, the light efficiency of the display apparatus including the bank may be improved.

In an embodiment, the total weight of the second scattering particles in each of the plurality of banks may be greater than or equal to about 10 times of the total weight of the first scattering particles in each of the plurality of banks.

In an embodiment, an average diameter of the first scattering particles may be in a range of about 50 nm to about 300 nm.

In an embodiment, an average diameter of the first scattering particles may be in a range of about 100 nm to about 200 nm.

In an embodiment, an average diameter of the first scattering particles may be in a range of about 150 nm to about 180 nm.

In case that the average diameter of the first scattering particles satisfies the above numerical range, reflectance of the bank with respect to visible light may be improved. As a result, the light efficiency of the display apparatus including the bank may be improved.

In an embodiment, an average diameter of the second scattering particles may be in a range of about 50 nm to about 170 nm.

In an embodiment, an average diameter of the second scattering particles may be in a range of about 70 nm to about 160 nm.

In an embodiment, an average diameter of the second scattering particles may be in a range of about 120 nm to about 160 nm.

In case that the average diameter of the second scattering particles satisfies the above numerical range, the transmittance of the bank with respect to light having a wavelength of less than or equal to about 400 nm and light having a wavelength of greater than or equal to about 800 nm may be improved. As a result, the pattern of the bank may be more densely and precisely formed.

Furthermore, in case that the average diameter of the first scattering particles and the average diameter of the second scattering particles simultaneously satisfy the above numerical ranges, a dense and precise pattern and the light efficiency of the display apparatus may be balanced.

In an embodiment, each of the plurality of banks may have a thickness of greater than or equal to about 10 μm.

In an embodiment, each of the plurality of banks may be formed of a single layer.

In an embodiment, the first scattering particles may include $TiO_2$.

In an embodiment, the first scattering particles may be spherical.

In an embodiment, the second scattering particles may include $SiO_2$.

In an embodiment, the second scattering particles may be spherical.

In an embodiment, the second scattering particles may be hollow particles.

In an embodiment, each of the second scattering particles may include a core and a shell.

In an embodiment, the shell may be formed on a surface of the core to cover at least a portion of the surface of the core.

In an embodiment, the core may include silica, and the shell may include a transition metal. The transition metal may be at least one of gold and silver.

In an embodiment, a refractive index ($n_3$) of the shell may be in a range of about 1.45 to about 1.55.

A refractive index ($n_3$) of the shell and the refractive index ($n_0$) of the polymer host may satisfy Condition 3 below.

$$|n_3 - n_0| < 0.1 \qquad \text{[Condition 3]}$$

In case that the refractive index of the shell satisfies the above numerical range and Condition 3 above, recognition of the second scattering particles may be suppressed.

In an embodiment, each of the plurality of banks may further include a pigment.

In an embodiment, the pigment may have a black color.

In an embodiment, the pigment may absorb light in a wavelength range of about 350 nm to about 650 nm.

In an embodiment, each of the plurality of banks may include a first bank layer including the first scattering particles and the second scattering particles, and a second bank layer directly contacting a surface of the first bank layer and including a pigment.

In an embodiment, a thickness of the second bank layer may be less than a thickness of the first bank layer.

In an embodiment, the second bank layer may be disposed closer to a light source than the first bank layer.

In an embodiment, optical densities of the first bank layer and the second bank layer may independently be in a range of about 0.01/μm to about 0.2/μm.

In an embodiment, at least one of the plurality of light-emitting devices may include a light source that emits blue light.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
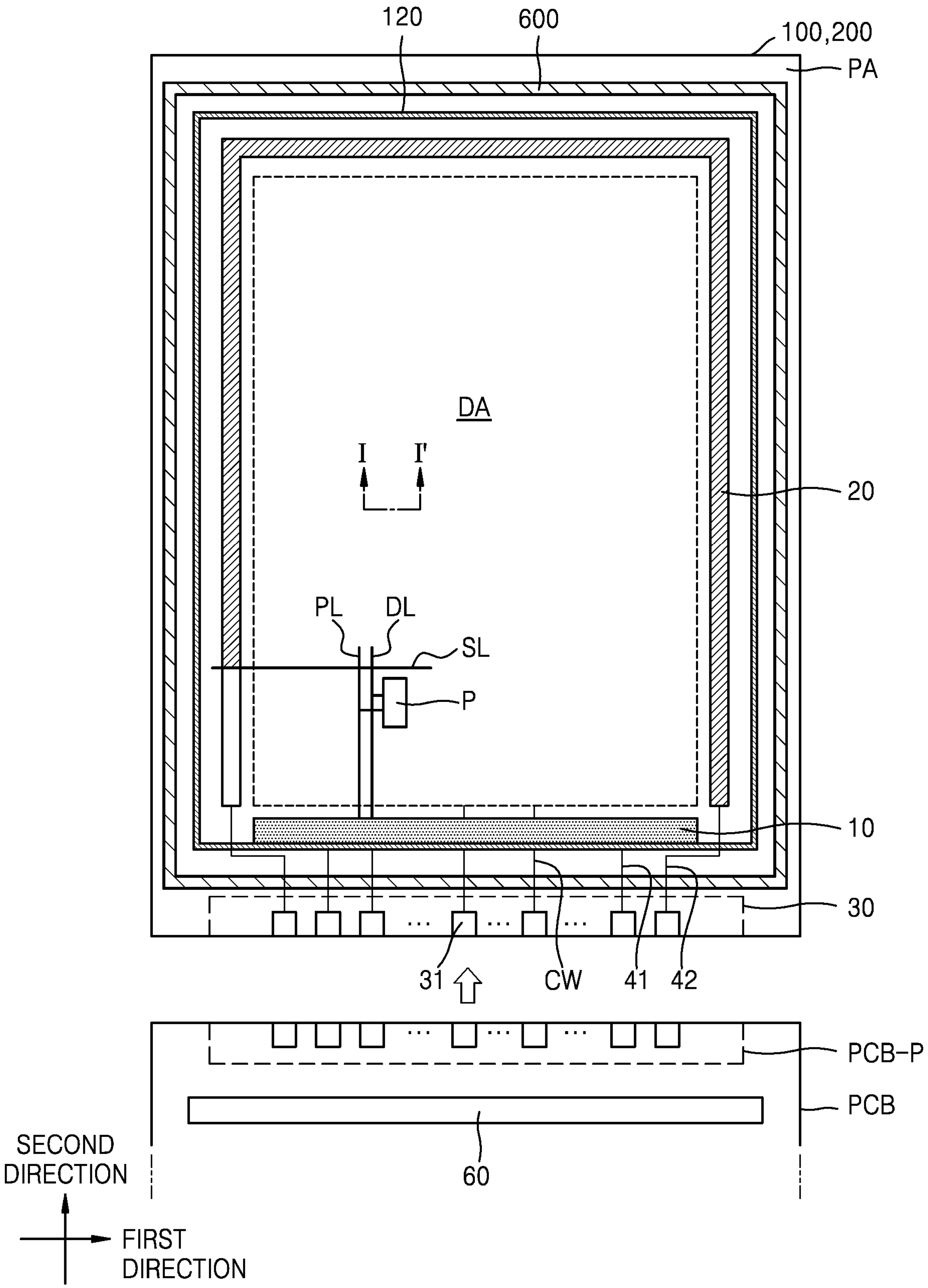
FIG. 1A is a schematic plan view illustrating a display apparatus according to embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a and b" indicates only a, only b, or any combination of a and b. The expression "at least one of a, b, and c" and "at least one selected from the group consisting of a, b, and c" indicates only a, only b, only c, both a and b, both a and c, both b and c, all of a, b, and c, or variations thereof. Also, "at least two of a, b, and c" indicates as both a and b, both a and c, both b and c, all of a, b, and c, or variations thereof.

Since the disclosure can apply various transformations and have various embodiments, specific embodiments will be illustrated in the drawings and described in detail in the detailed description. The effects and features of the disclosure and methods of accomplishing the same will become apparent from the following description of the embodiments in detail, taken in conjunction with the accompanying drawings. The disclosure may, however, be embodied in many different forms and should not be construed as limited to the embodiments set forth herein.

Hereinafter, embodiments of the disclosure will be described in detail with reference to the accompanying drawings, wherein like reference numerals refer to the same or corresponding components throughout the drawings, and a redundant description thereof will be omitted.

In the following embodiments, the terms "first," "second," and the like are used herein to describe various types of elements, do not have limited meaning but are used for the purpose of distinguishing one component from another component. Thus, a first element discussed below could be termed a second element without departing from the teachings of the disclosure.

The terminology used herein is for the purpose of describing particular embodiments and is not intended to be limiting. The expressions used in the singular such as "a," "an," and "the" are intended to include the plural forms as well, unless the context clearly indicates otherwise.

It will be understood that the terms such as "includes," "including," "comprises," "comprising," and/or "having" specify the presence of stated features, components, integers, steps, operations, elements, and/or groups thereof, but do not preclude the presence or addition of one or more other features, components Integers, steps, operations, elements, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

In the following embodiments, it will be understood that when an element such as a layer, film, region, or substrate is referred to as being "on" or "connected to" another element, it can be directly on the other element or intervening elements may also be present. In contrast, when an element is referred to as being "directly on" another element, no intervening elements are present. To this end, the term "connected" may refer to physical, electrical, and/or fluid connection, with or without intervening elements. Further, the first direction, the second direction, and the third direction are not limited to three axes of a rectangular coordinate system, such as the x, y, and z axes, and may be interpreted in a broader sense. For example, the first direction, the second direction, and the third direction may be perpendicular to one another, or may represent different directions that are not perpendicular to one another.

Spatially relative terms, such as "below," "lower," "above," "upper," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degree or at other orientations), and, as such, the spatially relative descriptors used herein interpreted accordingly.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. In the drawings, components may be exaggerated or reduced in size for convenience of description. For example, the sizes and thicknesses of the respective components shown in the drawings are arbitrarily shown for convenience of description, and embodiments are not necessarily limited thereto. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the following embodiments, it will be understood that when a layer, a region, a component, or the like is referred to as being connected to another layer, region, or component, it can be directly connected to another layer, region, or component, or it can be indirectly connected to another layer, region, or component by having an intervening layer, region, or component interposed therebetween. For example, in the specification, it will be understood that when a layer, a region, a component, or the like is referred to as being electrically connected to another layer, region, or component, it can be electrically connected directly to another layer, region, or component, or it can be electrically connected indirectly to another layer, region, or component by having an intervening layer, region, or component interposed therebetween.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

The display surface may be parallel to a surface defined by a first direction and a second direction. A normal direction of the display surface, i.e., a thickness direction of the display device DD, may indicate a third direction. In this specification, an expression of "when viewed from a plane, on a plane, or in a plan view" may represent a case when viewed in the third direction. Hereinafter, a front surface (or a top surface) and a rear surface (or a bottom surface) of each of layers or units may be distinguished by the third direction. However, directions indicated by the first to third directions may be a relative concept, and converted with respect to each other, e.g., converted into opposite directions.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A display apparatus may be an apparatus that displays an image, and may be an organic light-emitting display apparatus, an inorganic light-emitting display apparatus, a quantum dot light-emitting display apparatus, or the like.

Hereinafter, an organic light-emitting display apparatus will be described as a display apparatus according to an embodiment, but the display apparatus is not limited thereto. Various types of display apparatuses may be used.

Figure 1B:
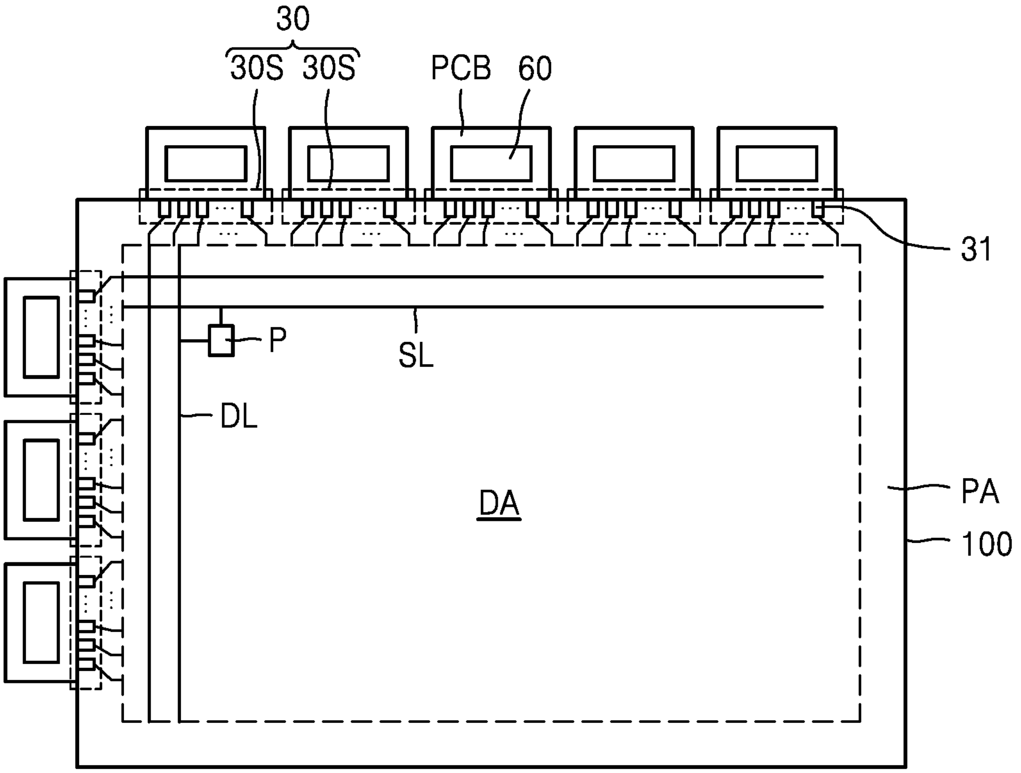
FIG. 1B is a schematic plan view illustrating a display apparatus according to embodiments.

FIGS. 1A and 1B are schematic plan views illustrating a display apparatus according to embodiments.

Referring to FIG. 1A, the display apparatus may be formed by bonding a substrate 100 and an upper substrate 200 by a sealing member 600. The sealing member 600 may be formed to surround sides of the substrate 100 and the upper substrate 200 to bond the substrate 100 and the upper substrate 200.

The display apparatus may include a display area DA and a peripheral area PA disposed adjacent to the display area DA. The display apparatus may provide an image using light emitted from multiple pixels P disposed in the display area DA.

The display area DA may include pixels P connected to scan lines SL extending in a first direction and data lines DL extending in a second direction intersecting the first direction. Each pixel P may also be connected to a driving voltage line PL extending in the second direction.

Each of the pixels P may include a display element such as an organic light-emitting diode OLED, an inorganic light-emitting diode ILED, or the like. Each pixel P may emit, for example, red, green, blue, or white light through the display element. The pixel P in the specification may be understood as a subpixel that emits light having at least one of a red color, a green color, a blue color, and a white color as described above. In embodiments, the display elements included in the pixels P may emit a same color light, and a color of each pixel P may be implemented by a color filter or the like disposed on the display element.

Each pixel P may be electrically connected to embedded circuits disposed in the peripheral area PA. A first power supply line 10, a second power supply line 20, and a pad part 30 may be disposed in the peripheral arca PA.

The first power supply line 10 may be disposed to correspond to a side of the display area DA. The first power supply line 10 may be connected to multiple driving voltage lines PL that transmit a driving voltage ELVDD (see, e.g., FIGS. 2A and 2B) to the pixel P.

The second power supply line 20 may have an open loop shape with a side open and partially surround the display area DA. The second power supply line 20 may provide a common voltage to a counter electrode of the pixel P. The second power supply line 20 may be a common voltage supply line.

The pad part 30 may include multiple pads 31 and may be disposed at a side of the substrate 100. Each of the pads 31 may be connected to a first connection line 41 connected to the first power supply line 10 or a connection line CW extending to the display area DA. The pads 31 of the pad part 30 may be exposed without being covered by an insulating layer and may be electrically connected to a printed circuit board PCB. A PCB terminal PCB-P of the printed circuit board PCB may be electrically connected to the pad part 30 (see, e.g., FIG. 1B).

The printed circuit board PCB may transmit a signal from a controller (not shown) or power to the pad part 30. The controller may supply the driving voltage ELVDD (see FIGS. 2A and 2B) to the first power supply line 10 through the first connection line 41 and a common voltage ELVSS (see FIGS. 2A and 2B) to the second power supply line 20 through a second connection line 42.

A data driving circuit 60 may be electrically connected to the data line DL. A data signal of the data driving circuit 60 may be provided to each pixel P through the connection line CW connected to the pad part 30 and the data line DL connected to the connection line CW. Although FIGS. 1A and 1B illustrate that the data driving circuit 60 is disposed on the printed circuit board PCB, the disclosure is not limited thereto, and in another embodiment, the data driving circuit 60 may be disposed on the substrate 100. For example, the data driving circuit 60 may be disposed between the pad part 30 and the first power supply line 10.

A dam part 120 may be disposed in the peripheral area PA. The dam part 120 may block an organic material from flowing toward an edge of the substrate 100 during an organic encapsulation layer 420 (see FIG. 3) of a thin film encapsulation layer 400 is formed, thereby preventing the formation of an edge tail of the organic encapsulation layer 420. The dam part 120 may be disposed in the peripheral area PA and surround at least a portion of the display area DA. The dam part 120 may include multiple dams, and each of the dams may be formed to be spaced apart from each other. The dam part 120 may be disposed closer to the display area DA than the sealing member 600 in the peripheral area PA. An embedded driving circuit part (not shown) for providing a scan signal to each pixel may be further provided in the peripheral area PA. In embodiments, the embedded driving circuit part and the dam part 120 may be formed to overlap each other in a plan view.

Although FIG. 1A illustrates that one printed circuit board PCB is connected to the pad part 30, as shown in FIG. 1B, multiple printed circuit boards PCB may be connected to the pad part 30.

Also as shown in FIG. 1B, the pad part 30 may be disposed on two sides of the substrate 100. The pad part 30 may include multiple sub-pad parts 30S, and a printed circuit board PCB may be attached to each sub-pad part 30S.

Figure 2A:
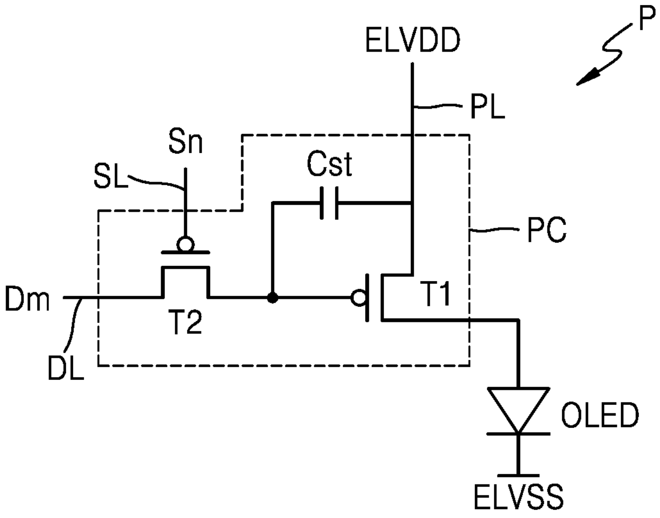
FIG. 2A is a schematic diagram of an equivalent circuit of a pixel of a display apparatus according to an embodiment.
Figure 2B:
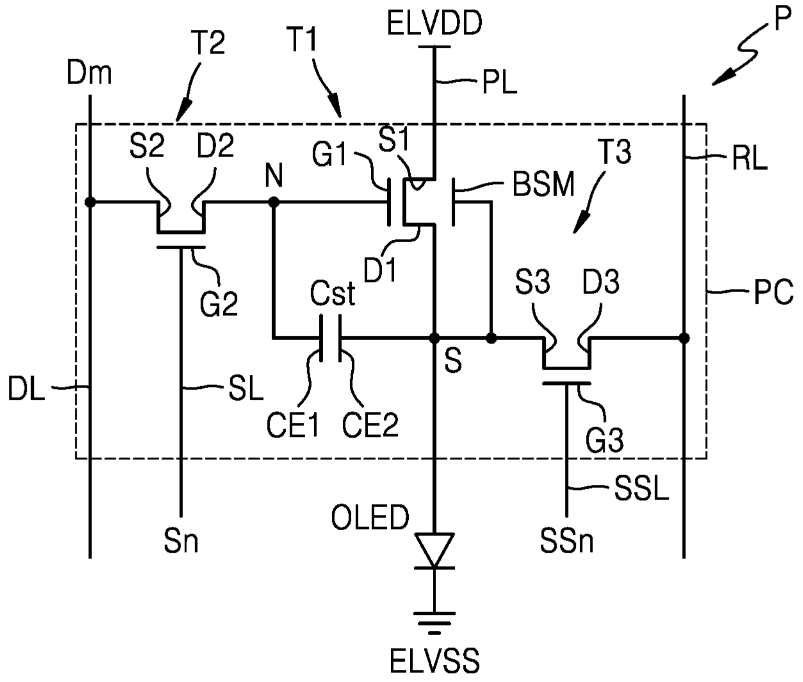
FIG. 2B is a schematic diagram of an equivalent circuit of a pixel of a display apparatus according to an embodiment.

FIGS. 2A and 2B are each schematic diagrams of equivalent circuits of a pixel P of a display apparatus according to an embodiment.

Referring to FIG. 2A, each pixel P may include a pixel circuit PC connected to a scan line SL and a data line DL and an organic light-emitting diode OLED connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL and may transmit a data signal Dm input from the data line DL to the driving thin film transistor T1 according to a scan signal Sn input from the scan line SL.

The storage capacitor Cst may be connected to the switching thin film transistor T2 and a driving voltage line PL and may store a voltage corresponding to a difference between a voltage received from the switching thin film transistor T2 and a first power voltage ELVDD (or a driving voltage) supplied to the driving voltage line PL.

The driving thin film transistor T1 may be connected to the driving voltage line PL and the storage capacitor Cst and may control a driving current flowing from the driving voltage line PL to the organic light-emitting diode OLED according to a voltage value stored in the storage capacitor Cst. The organic light-emitting diode OLED may emit light having a luminance according to the driving current.

FIG. 2A illustrates that the pixel circuit PC includes two thin film transistors and a storage capacitor, but the disclosure is not limited thereto.

Referring to FIG. 2B, each pixel P may include an organic light-emitting diode OLED and a pixel circuit PC which includes multiple thin film transistors for driving the organic light-emitting diode OLED. The pixel circuit PC may include a driving thin film transistor T1, a switching thin film transistor T2, a sensing thin film transistor T3, and a storage capacitor Cst.

A scan line SL may be connected to a gate electrode G2 of the switching thin film transistor T2, a data line DL may be connected to a source electrode S2 of the switching thin film transistor T2, and a first electrode CE1 of the storage capacitor Cst may be connected to a drain electrode D2 of the switching thin film transistor T2.

Accordingly, the switching thin film transistor T2 may supply a data voltage DM of the data line DL to a first node N in response to a scan signal Sn from the scan line SL of each pixel P.

A gate electrode G1 of the driving thin film transistor T1 may be connected to the first node N, a source electrode S1 of the driving thin film transistor T1 may be connected to a driving voltage line PL transmitting a driving voltage ELVDD, and a drain electrode D1 of the driving thin film transistor T1 may be connected to an anode of the organic light-emitting diode OLED.

Accordingly, the driving thin film transistor T1 may control an amount of current flowing to the organic light-emitting diode OLED according to a source-gate voltage of the driving thin film transistor T1, for example, a voltage of the driving voltage ELVDD proportional to a voltage applied to the first node N.

A sensing control line SSL may be connected to a gate electrode G3 of the sensing thin film transistor T3, a source electrode S3 of the sensing thin film transistor T3 may be connected to a second node S, and a drain electrode D3 of the sensing thin film transistor T3 may be connected to a reference voltage line RL. In another embodiment, the sensing thin film transistor T3 may be controlled by the scan line SL instead of the sensing control line SSL.

The sensing thin film transistor T3 may sense a potential of a pixel electrode (for example, an anode, see, e.g., FIG. 3) of the organic light-emitting diode OLED. The sensing thin film transistor T3 may supply a pre-charging voltage from the reference voltage line RL to the second node S in response to a sensing signal SSn from the sensing control line SSL or may supply a voltage of the pixel electrode (for example, the anode) of the organic light-emitting diode OLED to the reference voltage line RL during a sensing period.

In the storage capacitor Cst, the first electrode CE1 may be connected to the first node N, and a second electrode CE2 may be connected to the second node S. The storage capacitor Cst may be charged with a voltage difference between voltages respectively supplied to the first and second nodes N and S and may supply the voltage difference as a driving voltage to the driving thin film transistor T1. For example, the storage capacitor Cst may be charged with a voltage difference between the data voltage Dm and the pre-charging voltage respectively supplied to the first and second nodes N and S.

A bias electrode BSM may be formed to correspond to the driving thin film transistor T1 and may be connected to the source electrode S3 of the sensing thin film transistor T3. Since the bias electrode BSM receives a voltage from the source electrode S3 of the sensing thin film transistor T3, the driving thin film transistor T1 may be stabilized. In another embodiment, the bias electrode BSM may not be connected to the source electrode S3 of the sensing thin film transistor T3 and may be connected to a separate bias line.

A counter electrode (for example, a cathode) of the organic light-emitting diode OLED may receive a common voltage ELVSS. The organic light-emitting diode OLED may emit light by receiving a driving current from the driving thin film transistor T1.

Although FIG. 2B illustrates that the signal lines SL, SSL, and DL, the reference voltage line RL, and the driving voltage line PL are provided for each pixel P, the disclosure is not limited thereto. The signal lines SL, SSL, and DL may be the scan line SL, the sensing control line SSL, and the data line DL. For example, at least one of the signal lines SL, SSL, and DL, the reference voltage line RL, and the driving voltage line PL may be shared by neighboring (or adjacent) pixels.

The pixel circuit PC is not limited to the number and circuit design of thin film transistors and storage capacitors described with reference to FIGS. 2A and 2B, and the number and circuit design of the thin film transistors and the storage capacitors may be variously changed.

Figure 3:
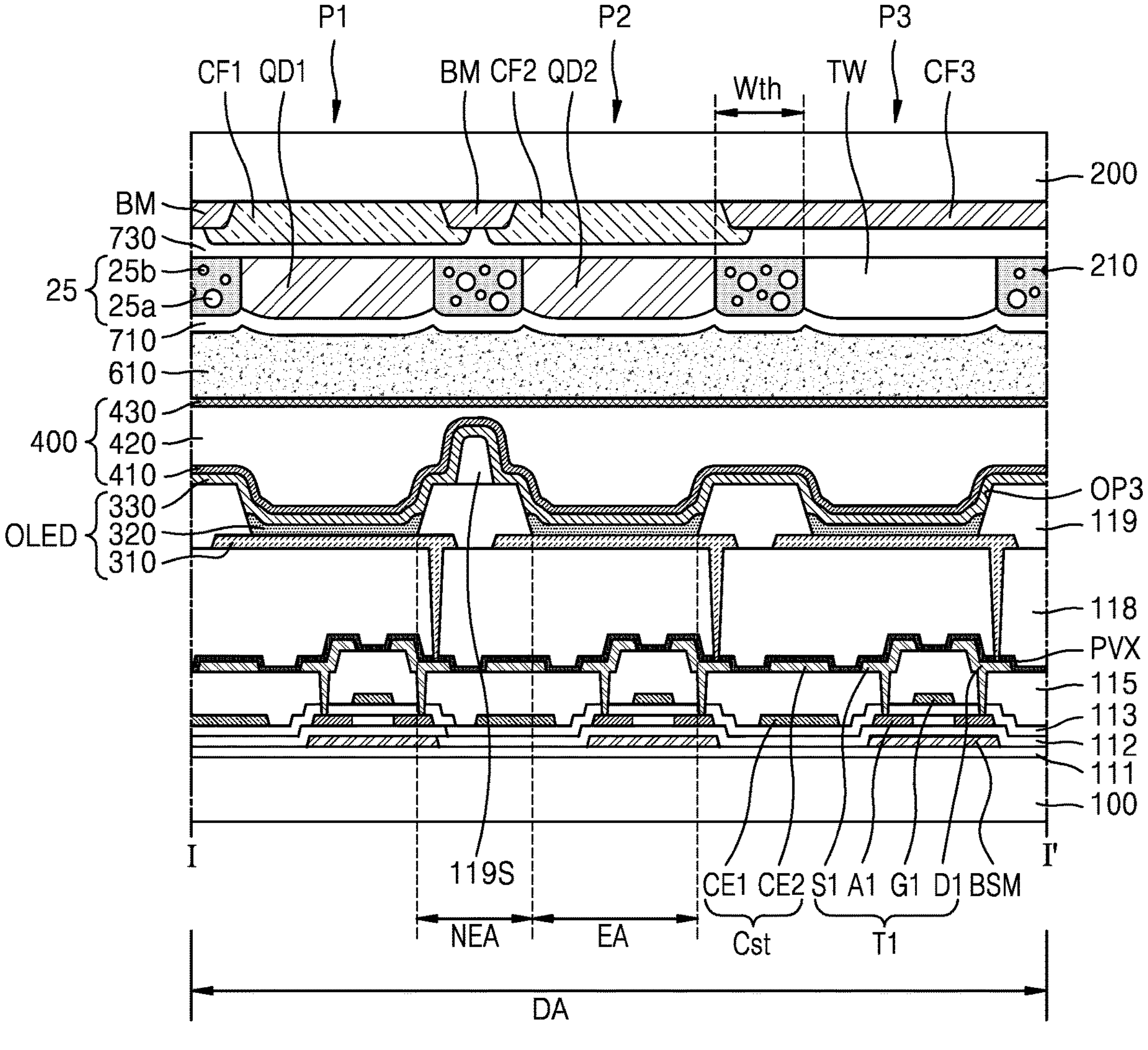
FIG. 3 is a schematic cross-sectional view illustrating a portion of a display area of a display apparatus according to an embodiment, and corresponds to a cross-section taken along line I-I' of FIG. 1A.
Figure 4:
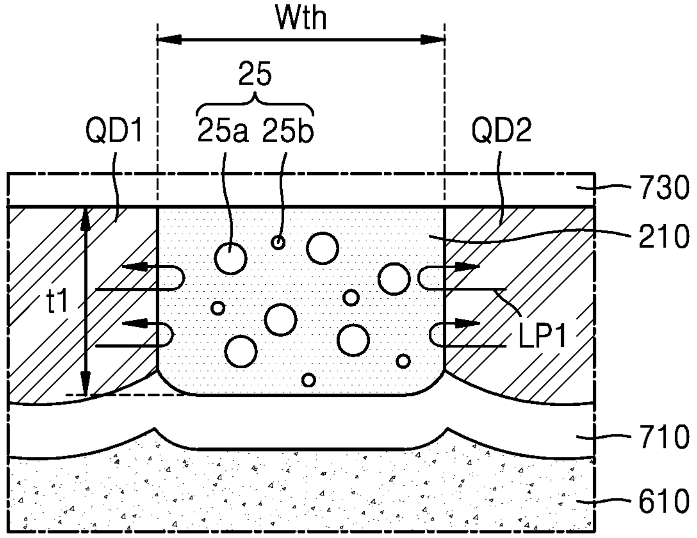
FIG. 4 is a schematic enlarged view of a portion of FIG. 3.

FIG. 3 is a schematic cross-sectional view illustrating a portion of a display area DA of a display apparatus according to an embodiment, and corresponds to a cross section taken along line I-I' of FIG. 1A. FIG. 4 is a schematic enlarged view of a bank 210 of FIG. 3.

Referring to FIG. 3, at least one thin film transistor T1 (for example, a driving thin film transistor T1) and a display element connected to the thin film transistor T1 may be disposed in a display area DA of the display apparatus according to an embodiment.

A driving thin film transistor T1 and a storage capacitor Cst of a pixel circuit PC of each pixel P described with reference to FIGS. 2A and 2B may be disposed in the display arca DA of FIG. 3.

In an embodiment, the display area DA of the display apparatus may include multiple pixels P1, P2, and P3, and each of the pixels P1, P2, and P3 may include an emission arca EA. The emission arca EA may be an area in which light is generated and emitted to an outside. A non-emission area NEA may be disposed between the emission areas EA, and the emission areas EA of the pixels P1, P2, and P3 may be distinguished by the non-emission arca NEA.

Multiple pixels P1, P2, and P3 may include a first pixel P1, a second pixel P2, and a third pixel P3, and the first pixel P1, the second pixel P2, and the third pixel P3 may emit lights having different colors. For example, the first pixel P1 may emit red light, the second pixel P2 may emit green light, and the third pixel P3 may emit blue light. In a plan view, the emission area EA of each pixel P1, P2, or P3 may have various shapes such as polygon, circle, and the like, and in embodiments, the emission areas EA may have various arrangements such as a stripe arrangement, a PenTile® arrangement, and the like.

The display apparatus according to an embodiment may include at least one color conversion layer corresponding to at least one pixel P1, P2, or P3. The number of pixels and the number of color conversion layers may be the same or different.

For example, referring to FIG. 3, a first color conversion layer QD1 and a second color conversion layer QD2 may correspond to the first pixel P1 and the second pixel P2, respectively. The first and second color conversion layers QD1 and QD2 may include quantum dots and scattering particles.

For example, the first and second color conversion layers QD1 and QD2 may include the first color conversion layer QD1 disposed in the first pixel P1 and the second color conversion layer QD2 disposed in the second pixel P2. The first color conversion layer QD1 may include first quantum dots (not shown), and the second color conversion layer QD2 may include second quantum dots (not shown).

A color conversion layer may not be disposed in the emission area of the third pixel P3, and a transmission window TW may be disposed in the emission area of the third pixel P3. The transmission window TW may be made of an organic material transmitting light without converting a wavelength of light emitted from an organic light-emitting diode OLED of the third pixel P3.

All organic light-emitting diodes OLED in the first pixel P1, the second pixel P2, and the third pixel P3 may emit a same color light. For example, the organic light-emitting diodes OLED may emit blue light.

Hereinafter, for convenience of description, components disposed in the display area DA of FIG. 3 will be described according to a stacking order.

A substrate 100 may include a glass, a ceramic, a metal, a material having flexible or bendable characteristics, or the like. In case that the substrate 100 has flexible or bendable characteristics, the substrate 100 may include a polymer resin including polyethersulphone (PES), polyacrylate (PAR), polyetherimide (PEI), polyethylene naphthalate (PEN), polyethylene terephthalate (PET), polyphenylene sulfide (PPS), polyarylate, polyimide (P1), polycarbonate (PC), cellulose acetate propionate (CAP), the like, or a combination thereof. The substrate 100 may have a single-layered or multi-layered structure including the above materials. In case that the substrate 100 has a multi-layered structure, the substrate 100 may further include an inorganic layer. In embodiments, the substrate 100 may have an organic/inorganic/organic structure.

A barrier layer (not shown) may be disposed between the substrate 100 and a first buffer layer 111. The barrier layer may prevent or minimize impurities from penetrating into a semiconductor layer A1 from the substrate 100 or the like. The barrier layer may include an inorganic material such as an oxide, a nitride, or the like, an organic material, or an organic/inorganic composite and may have a single-layered or multi-layered structure of inorganic and organic materials.

A bias electrode BSM may be disposed on the first buffer layer 111 corresponding to the driving thin film transistor T1. A voltage may be applied to the bias electrode BSM. For example, the bias electrode BSM may be connected to a source electrode S3 (see FIG. 2B) of a sensing thin film transistor T3 (see FIG. 2B), and a voltage of the source electrode S3 may be applied to the bias electrode BSM. The bias electrode BSM may prevent external light from reaching the semiconductor layer A1. Accordingly, the characteristics of the driving thin film transistor T1 may be stabilized. However, the disclosure is not limited thereto, and the bias electrode BSM may be omitted.

The semiconductor layer A1 may be disposed on a second buffer layer 112. The semiconductor layer A1 may include amorphous silicon, polysilicon, or the like. In another embodiment, the semiconductor layer A1 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In embodiments, the semiconductor layer A1 may be made of a Zn oxide-based material such as Zn oxide, In—Zn oxide, Ga—In—Zn oxide, or the like. In another embodiment, the semiconductor layer A1 may be made of an In—Ga—Zn—O (IGZO), In—Sn—Zn—O (ITZO), or In—Ga—Sn—Zn—O (IGTZO) semiconductor in which a metal such as indium (In), gallium (Ga), tin (Sn), or the like is included in ZnO. The semiconductor layer A1 may include a channel region and a source region and a drain region disposed at each side of the channel region. The semiconductor layer A1 may have a single layer or multiple layers.

A gate electrode G1 may be disposed on the semiconductor layer A1 and at least partially overlap the semiconductor layer A1 in a plan view with a gate insulating layer 113 interposed between the semiconductor layer A1 and the gate electrode G1. The gate electrode G1 may include molybdenum (Mo), aluminum (Al), copper (Cu), titanium (Ti), the like, or an alloy thereof and may be provided as a single layer or multiple layers. For example, the gate electrode G1 may be a single layer of Mo. A first electrode CE1 of the storage capacitor Cst and the gate electrode G1 may be disposed on a same layer. The first electrode CE1 and the gate electrode G1 may be made of a same material.

An interlayer insulating layer 115 may be disposed on the gate insulating layer 113 and cover the gate electrode G1 and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), the like, or a combination thereof.

A second electrode CE2 of the storage capacitor Cst, a source electrode S1, a drain electrode D1, and a data line DL (not illustrated in FIG. 3) may be disposed on the interlayer insulating layer 115.

The second electrode CE2 of the storage capacitor Cst, the source electrode S1, the drain electrode D1, and the data line DL may each include a conductive material such as molybdenum (Mo), aluminum (Al), copper (Cu), titanium (Ti), the like, or an alloy thereof and may be formed as multiple layers or single layer including the above materials. For example, the second electrode CE2, the source electrode S1, the drain electrode D, and the data line DL may have a multi-layered structure of Ti/Al/Ti. The source electrode S1 or the drain electrode D1 may be connected to the source region or the drain region of the semiconductor layer A1 through a contact hole.

The second electrode CE2 of the storage capacitor Cst may overlap the first electrode CE1 in a plan view with the interlayer insulating layer 115 interposed between the first electrode CE1 and the second electrode CE2 and may form a capacitor. The interlayer insulating layer 115 may function as a dielectric layer of the storage capacitor Cst.

The second electrode CE2 of the storage capacitor Cst, the source electrode S1, the drain electrode D1, and the data line DL may be covered by an inorganic protective layer PVX.

The inorganic protective layer PVX may be a single film or a multi-layered film including silicon nitride ($SiN_x$), silicon oxide ($SiO_x$), the like, or a combination thereof. The inorganic protective layer PVX may cover and protect lines disposed on the interlayer insulating layer 115. Lines (not shown) formed together with the data line DL in a same process may be exposed in a partial area (for example, a portion of a peripheral area PA) of the substrate 100. Exposed portions of the lines may be damaged by an etchant used during patterning of a pixel electrode 310 to be described below. In an embodiment, since the inorganic protective layer PVX covers at least portions of the data line DL and the lines formed together with the data lines DL, the lines may be prevented from being damaged during a patterning process of the pixel electrode 310.

A planarization layer 118 may be disposed on the inorganic protective layer PVX, and the organic light-emitting diode OLED may be disposed on the planarization layer 118.

The planarization layer 118 may be formed as a single layer or multiple layers of a film made of an organic material and may provide a flat upper surface. The planarization layer 118 may include a general-purpose polymer such as benzocyclobutene (BCB), P1, hexamethyldisiloxane (HMDSO), polymethylmethacrylate (PMMA), polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, the like, and a mixture thereof.

The organic light-emitting diode OLED may be disposed on the planarization layer 118 in the display area DA. The organic light-emitting diode OLED may include a pixel electrode 310, an intermediate layer 320 including an organic emission layer, and a counter electrode 330.

The pixel electrode 310 may be a (semi-)light-transmitting electrode or a reflective electrode. In embodiments, the pixel electrode 310 may include a reflective layer made of at least one of Ag, Mg, Al, Pt, Pd, Au, Ni, Nd, Ir, Cr, and a compound thereof, and a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In embodiments, the pixel electrode 310 may be made of ITO/Ag/ITO.

A pixel-defining film 119 may be disposed on the planarization layer 118. The pixel-defining film 119 may have an opening corresponding to each subpixel in the display arca DA, for example, a third opening OP3 exposing at least a central portion of the pixel electrode 310, thereby defining an emission area of a pixel P1, P2, or P3. The pixel-defining film 119 may increase a distance between an edge of the pixel electrode 310 and the counter electrode 330 above the pixel electrode 310, thereby preventing an arc or the like from occurring at the edge of the pixel electrode 310.

The pixel-defining film 119 may be formed by a method such as a spin coating method using at least one organic insulating material of P1, polyamide, an acrylic resin, BCB, and a phenol resin, or the like.

The intermediate layer 320 of the organic light-emitting diode OLED may include an organic emission layer. The organic emission layer may include an organic material including a fluorescent or phosphorescent material that emits red, green, blue, or white light. The organic emission layer may include a low molecular weight organic material or a high molecular weight organic material, and in an embodiment, a functional layer such as a hole transport layer (HTL), a hole injection layer (HIL), an electron transport layer (ETL), an electron injection layer (EIL), and the like may be disposed below or on the organic emission layer. The intermediate layer 320 may be disposed to correspond to each of the pixel electrodes 310. However, the disclosure is not limited thereto. The intermediate layer 320 may be modified in various ways such that the intermediate layer 320 is integrally formed with the pixel electrodes 310.

Although the intermediate layer 320 is illustrated in the drawing as being provided separately for each pixel P1, P2, or P3, the disclosure is not limited thereto. The intermediate layer 320 may be integrally formed over pixels P1, P2, or P3.

In an embodiment, the organic light-emitting diodes OLED provided in the first pixel P1, the second pixel P2, and the third pixel P3 may include organic emission layers that emit a same color light. For example, the organic light-emitting diodes OLED provided in the first pixel P1, the second pixel P2, and the third pixel P3 may emit blue light.

The counter electrode 330 may be a light-transmitting electrode or a reflective electrode. In embodiments, the counter electrode 330 may be a transparent or semi-transparent electrode and may be formed as a metal thin film made of at least one of Li, Ca, LiF/Ca, LiF/Al, Al, Ag, Mg, and a compound thereof which have a low work function. A transparent conductive oxide (TCO) film made of ITO, IZO, ZnO, $In_2O_3$, or the like may be further disposed on the metal thin film. The counter electrode 330 may be disposed in the display area DA and the peripheral area PA on the intermediate layer 320 and the pixel-defining film 119. The counter electrode 330 may be integrally formed with the organic light-emitting diodes OLED and may correspond to the pixel electrodes 310.

A spacer 119S for preventing a mask dent may be disposed on the pixel-defining film 119. The spacer 119S may be integrally formed with the pixel-defining film 119. For example, the spacer 119S and the pixel-defining film 119 may be simultaneously formed in a same process using a halftone mask process.

The organic light-emitting diode OLED may be damaged by external moisture or oxygen and may be covered and protected by a thin film encapsulation layer 400. The thin film encapsulation layer 400 may be disposed in the display area DA and may extend to the outside of the display area DA. The thin film encapsulation layer 400 may include at least one organic encapsulation layer and at least one inorganic encapsulation layer. For example, the thin film encapsulation layer 400 may include a first inorganic encapsulation layer 410, an organic encapsulation layer 420, and a second inorganic encapsulation layer 430.

The first inorganic encapsulation layer 410 may cover the counter electrode 330 and may include silicon oxide, silicon nitride, silicon oxynitride, the like, or a combination thereof. Although not shown, other layers such as a capping layer or the like may be interposed between the first inorganic encapsulation layer 410 and the counter electrode 330. Since the first inorganic encapsulation layer 410 is formed on structures under the first inorganic encapsulation layer 410, an upper surface of the first inorganic encapsulation layer 410 may be not flat. The organic encapsulation layer 420 may cover the first inorganic encapsulation layer 410, and unlike the first inorganic encapsulation layer 410, an upper surface of the organic encapsulation layer 420 may be substantially flat. The upper surface of the organic encapsulation layer 420 may be substantially flat at a portion corresponding to the display arca DA. The organic encapsulation layer 420 may include at least one of PET, PEN, PC, P1, polyethylene sulfonate, polyoxymethylene, polyarylate, and HMDSO. The second inorganic encapsulation layer 430 may cover the organic encapsulation layer 420 and may include silicon oxide, silicon nitride, silicon oxynitride, the like, or a combination thereof.

Even in case that cracks occur in the thin film encapsulation layer 400, due to such a multi-layered structure, the thin film encapsulation layer 400 may prevent cracks from propagating between the first inorganic encapsulation layer 410 and the organic encapsulation layer 420 or between the organic encapsulation layer 420 and the second inorganic encapsulation layer 430. Thus, the formation of a path by which external moisture or oxygen penetrates into the display area DA may be prevented or minimized.

A filler 610 may be disposed on the thin film encapsulation layer 400. The filler 610 may act as a buffer against external pressure or the like. The filler 610 may be made of an organic material such as methyl silicone, phenyl silicone, P1, the like, or a combination thereof. However, the disclosure is not limited thereto, and the filler 610 may be made of an organic material such as a urethane-based resin, an epoxy-based resin, an acryl-based resin, the like, or a combination thereof, or an inorganic material such as silicon or the like.

Color filters CF1, CF2, and CF3 and light-blocking patterns BM may be provided on an upper substrate 200 disposed to face the substrate 100. The color filters CF1, CF2, and CF3 may implement a full-color image, improve color purity, and improve outdoor visibility. A first color filter CF1 and light emitted from a first color conversion layer QD1 may be implemented to have a same color, a second color filter CF2 and light emitted from a second color conversion layer QD2 may be implemented to have a same color, and a third color filter CF3 and light emitted from the organic light-emitting diode OLED may be implemented to have a same color.

The light-blocking patterns BM may be disposed between the first color filter CF1, the second color filter CF2, and the third color filter CF3 corresponding to the non-emission area NEA. The light-blocking pattern BM may be a black matrix and may improve color sharpness and contrast. The light-blocking pattern BM may include at least one of a black pigment, a black dye, and black particles. In embodiments, the light-blocking pattern BM may include Cr, $CrO_x$, Cr/$CrO_x$, Cr/$CrO_x$/$CrN_y$, a resin (carbon pigment, RGB mixed pigment, or the like), graphite, a non-Cr-based material, the like, or a combination thereof. In embodiments, the light-blocking pattern BM may be formed by at least two of the first color filter CF1, the second color filter CF2, and the third color filter CF3 overlapping with each other in a plan view. For example, the third color filter CF3 may be disposed between the first pixel P1 and the second pixel P2, and the first color filter CF1 and the second color filter CF2 may partially overlap the third color filter CF3 in a plan view to function as the light-blocking pattern BM.

Although an embodiment in which the organic light-emitting diode OLED is adopted as a display element is described, the disclosure is not limited thereto. For example, the display element may be provided as a micro- or nano-sized inorganic light-emitting diode.

In an embodiment, the first and second color conversion layers QD1 and QD2, the transmission window TW, and the bank (or a partition wall) 210 may be disposed between the upper substrate 200 and the organic light-emitting diode OLED which is the display element disposed on the substrate 100.

The first color conversion layer GD1 may include first quantum dots, and the second color conversion layer QD2 may include second quantum dots. The first quantum dots and the second quantum dots may have excitation and emission characteristics according to a material and size of the first quantum dots and the second quantum dots and may convert incident light into light having a certain color. Various materials may be used for the first quantum dots and the second quantum dots. For example, each of the first quantum dots and the second quantum dots may include a Group II-VI compound, a Group III-V compound, a Group IV-VI compound, a Group IV element, a Group IV compound, or a combination thereof. The Group II-VI compound may be selected from: a binary compound such as CdSe, CdTe, ZnS, ZnSe, ZnTe, ZnO, HgS, HgSe, HgTe, MgSe, MgS, and a mixture thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group III-V compound may be selected from: a binary compound such as GaN, GaP, GaAs, GaSb, AlN, AlP, AlAs, AlSb, InN, InP, InAs, InSb, and a mixture thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group IV-VI compound may be selected from: a binary compound such as SnS, SnSe, SnTe, PbS, PbSe, PbTe, and a mixture thereof; a ternary compound such as SnSeS, SnSeTe, SnSTe, PbSeS, PbSeTe, PbSTe, SnPbS, SnPbSe, SnPbTe; and a mixture thereof; and a quaternary compound such as SnPbSSe, SnPbSeTe, SnPbSTe, and a mixture thereof. The Group IV element may be selected from Si, Ge, and a mixture thereof. The Group IV compound may be a binary compound such as SiC, SiGe, and a mixture thereof.

The binary compound, the ternary compound, or the quaternary compound may be present in particles with a uniform concentration, or may be present in particles with a concentration partially unequally distributed.

The first quantum dots and the second quantum dots may each have a core-shell structure having a core and a shell. The shell may have a concentration gradient in which a concentration of an element present in the shell decreases toward a center. The shell of the quantum dots may serve as a protective layer that prevents chemical denaturation of the core to maintain semiconductor properties and/or a charging layer that imparts electrophoretic properties to the quantum dots. The shell may have a single layer or multiple layers. The shells of the first quantum dots and the second quantum dots may include a metal oxide, a non-metal oxide, a semiconductor compound, the like, or a combination thereof.

For example, the metal or non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a mixture thereof; or a ternary compound such as $MgAl_2O_4$, $CoFc_2O_4$, $NiFe_2O_4$, $CoMn_2O_4$d, and a mixture thereof, but the disclosure is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, the like, or a mixture thereof, but the disclosure is not limited thereto.

The first quantum dot and the second quantum dot may have a size of less than or equal to about 45 nm. For example, the size of the first quantum dot and the second quantum dot may be less than or equal to about 40 nm. For example, the size of the first quantum dot and the second quantum dot may be less than or equal to about 30 nm. Color purity or color reproducibility may be improved within such a range. Since light generated through such quantum dots is emitted in all directions, a light viewing angle may be improved.

Types of the first quantum dots and the second quantum dots are not particularly limited as long as types of the first quantum dots and the second quantum dots are commonly used in the art. For example, types of spherical, pyramidal, multi-arm, or cubic nanoparticles, nanotubes, nanowires, nanofibers, nanoplatelet particles, the like, or a combination thereof may be used.

The cores of the first quantum dots and the second quantum dots may have a diameter in a range of about 2 nm to about 10 nm, and in case that the first quantum dots and the second quantum dots are exposed to light, the first quantum dots and the second quantum dots may emit light having a frequency according to a particle size and a type of a material. An average size of the first quantum dots and an average size of the second quantum dots may be different from each other. For example, as a size of quantum dots becomes greater, light having a longer wavelength may be emitted. Accordingly, a size of quantum dots may be selected according to colors of the first pixel P1 and the second pixel P2.

In an embodiment, the organic light-emitting diodes OLED in the first, second, and third pixels P1, P2, and P3 may emit light having a same wavelength, and the colors of the first pixel P1 and the second pixel P2 may be determined by colors of light emitted by the first quantum dots and the second quantum dots. Since a color conversion layer is not provided in the emission area EA of the third pixel P3, a color of the third pixel P3 may be a color of light emitted by the organic light-emitting diode OLED. For example, the organic light-emitting diode OLED may emit light having a blue wavelength. The first pixel P1 may emit light of a red color, the second pixel P2 may emit light of a green color, and the third pixel P3 may emit light of a blue color.

In embodiments, the cores of the first quantum dots and the second quantum dots may be made of CdSe or the like. An average size of the cores of the first quantum dots, for example, an average diameter of the cores of the first quantum dots, may be about 5 nm, and an average diameter of the cores of the second quantum dots may be about 3 nm.

In addition to quantum dots, the color conversion layers QD1 and QD2 may include various materials that can mix and properly disperse quantum dots. For example, a solvent, a photo-initiator, a binder polymer, a dispersant, and/or the like may be further included.

The color conversion layer may not be provided in the emission area EA of the third pixel P3, and the transmission window TW may be disposed. The transmission window TW may be made of an organic material transmitting light without converting a wavelength of light emitted from the organic light-emitting diode OLED of the third pixel P3.

The bank 210 may be disposed between the first color conversion layer QD1, the second color conversion layer QD2, and the transmission window TW to correspond to the non-emission area NEA. The bank 210 may be disposed between the first color conversion layer QD1 and the second color conversion layer QD2 and between the second color conversion layer QD2 and the transmission window TW.

The bank 210 may include a polymer host, and first scattering particles 25*a* and second scattering particles 25*b* may be dispersed in the polymer host. The polymer host may include a general-purpose polymer such as P1, HMDSO, PMM, or polystyrene (PS), a polymer derivative having a phenol-based group, an acryl-based polymer, an imide-based polymer, an aryl ether-based polymer, or an amide-based polymer, a fluorine-based polymers, a p-xylene-based polymer, a vinyl alcohol-based polymer, the like, and a mixture thereof.

As shown in FIG. 4, the bank 210 may include a pigment (not shown) and the first and second scattering particles 25*a* and 25*b*. The first scattering particles 25*a* and the second scattering particles 25*b* may reflect and scatter light incident on the bank 210 from the color conversion layers QD1 and QD2 and the transmission window TW. The pigment may block or absorb light incident from an organic light-emitting diodes OLED in adjacent pixels.

For example, light emitted from the first color conversion layer QD1 and the second color conversion layer QD2 may be transmitted through the quantum dots and may be emitted in all directions. Among the light, light LP1 traveling toward a first bank layer (not shown) may be reflected by bank-scattering particles 25 included in the first bank layer (not shown) and may be incident on the first color conversion layer QD1 and the second color conversion layer QD2 again. The bank-scattering particles 25 may include the first scattering particles 25*a* and the second scattering particles 25*b*. Reflected light may excite the quantum dots, thereby improving light efficiency. Light having a wavelength of about 450 nm may be reflected from the bank 210, thereby further improving the light efficiency of the display apparatus.

A first protective layer 710 may be provided below the first and second color conversion layers QD1 and QD2, the transmission window TW, and the bank 210, and a second protective layer 730 may be provided on the first and second color conversion layers QD1 and QD2, the transmission window TW, and the bank 210. The first protective layer 710 and the second protective layer 730 may serve to protect the first and second color conversion layers QD1 and QD2 and the transmission window TW from being contaminated by other components disposed below the first protective layer 710 and on the second protective layer 730. The first protective layer 710 and the second protective layer 730 may be made of an inorganic insulating material. For example, the first protective layer 710 and/or the second protective layer 730 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Light incident from the organic light-emitting diode OLED, incident from the color conversion layer, or incident from the transmission window TM may be reflected by the first scattering particles 25*a* and the second scattering particles 25*b*. The light efficiency of the display apparatus may be increased by light reflected by the first scattering particles 25*a* and the second scattering particles 25*b*.

A display apparatus according to an embodiment may include: a substrate 100 on which multiple light-emitting devices are disposed; multiple color conversion layers QD1 and QD2 disposed on the substrate 100 and corresponding to the light-emitting devices; and multiple banks 210 disposed between the color conversion layers QD1 and QD2.

Each of the banks 210 may include first scattering particles 25*a*, second scattering particles 25*b*, and a polymer host. A refractive index ($n_1$) of the first scattering particles 25*a* may be greater than a refractive index ($n_0$) of the polymer host. The refractive index ($n_1$) of the first scattering particles 25*a* and a refractive index ($n_2$) of the second scattering particles 25*b* may be different from each other.

In the display apparatus according to an embodiment, the refractive index ($n_1$) of the first scattering particles 25*a* and the refractive index ($n_0$) of the polymer host may satisfy Condition 1 below.

$$|n_1 - n_0| > 0.8 \quad \text{[Condition 1]}$$

The first scattering particles 25*a* and the polymer host may be selected to satisfy Condition 1 so that scattering and/or reflecting of visible light may be increased in the bank 210 including the first scattering particles 25*a*. As a result, the light efficiency of the display apparatus including the bank 210 may be increased.

In the display apparatus according to an embodiment, the refractive index ($n_2$) of the second scattering particles 25*b* may be less than the refractive index ($n_0$) of the polymer host. The refractive index ($n_2$) of the second scattering particles 25*b* may be less than or equal to about 1.5. For example, the refractive index ($n_2$) of the second scattering particles 25*b* may be less than or equal to about 1.0.

In case that the refractive index ($n_2$) of the second scattering particles 25*b* satisfies the above value, the transmittance of the bank 210 including the second scattering particles 25*b* with respect to light having a wavelength of less than or equal to 400 nm may be increased. As a result, an undercut phenomenon caused by ultraviolet light may be suppressed. The transmittance of the bank 210 including the second scattering particles 25*b* with respect to light having a wavelength of greater than or equal to about 800 nm may be improved. As a result, a recognition rate of a mask align key used to form a pattern may be improved. Accordingly, a pattern of the bank 210 may be precisely and densely formed.

In the display apparatus according to an embodiment, the refractive index ($n_2$) of the second scattering particles 25*b* and the refractive index ($n_0$) of the polymer host may satisfy Condition 2 below.

$$|n_2 - n_0| \leq 0.6 \quad \text{[Condition 2]}$$

In case that the refractive index ($n_2$) of the second scattering particles 25*b* satisfies Condition 2, the transmittance of the bank 210 including the second scattering particles 25*b* with respect to light having a wavelength of the less than or equal to about 400 nm may be increased. As a result, an undercut phenomenon caused by ultraviolet light may be further suppressed. The transmittance of the bank 210 including the second scattering particles 25*b* with respect to light having a wavelength of greater than or equal to 800 nm may be further improved. As a result, a recognition rate of a mask align key used to form a pattern may be further improved. Accordingly, the pattern of the bank 210 may be more precisely and densely formed.

The second scattering particles 25*b* may be used together with the first scattering particles 25*a*. In case that the second scattering particles 25*b* have the above refractive index, an increase in concentration of scattering particles and maintenance of a recognition rate of a mask align key may be achieved. As a result, the pattern of the bank 210 may be more densely formed, and the visibility of the bank 210 may be suppressed. At the same time, the light efficiency of the display apparatus including the bank 210 may be improved.

In the display apparatus according to an embodiment, the first scattering particles 25*a* may have an average diameter in a range of about 50 nm to about 300 nm. In an embodiment, the first scattering particles 25*a* may have an average diameter in a range of about 100 nm to about 200 nm. In embodiments, the first scattering particles 25*a* may have an average diameter in a range of about 150 nm to about 180 nm.

In case that the average diameter of the first scattering particles 25*a* satisfies the above numerical range, reflectance of the bank 210 with respect to visible light may be improved. As a result, the light efficiency of the display apparatus including the bank 210 may be improved.

In the display apparatus according to an embodiment, the second scattering particles 25*b* may have an average diameter in a range of about 50 nm to about 170 nm. In an embodiment, the second scattering particles 25*b* may have an average diameter in a range of about 70 nm to about 160 nm. In embodiments, the second scattering particles 25*b* may have an average diameter in a range of about 120 nm to about 160 nm.

In case that the average diameter of the second scattering particles 25*b* satisfies the above numerical range, the transmittance of the bank 210 with respect to light having a wavelength of less than or equal to about 400 nm and light having a wavelength of greater than or equal to about 800 nm may be improved. As a result, the pattern of the bank 210 may be more densely and precisely formed.

Furthermore, in case that the average diameter of the first scattering particles 25*a* and the average diameter of the second scattering particles 25*b* simultaneously satisfy the above numerical ranges, a dense and precise pattern may be formed and the light efficiency of the display apparatus may be improved.

Shapes of the first scattering particles 25*a* and the second scattering particles 25*b* are not particularly limited as long as shapes of the first scattering particles 25*a* and the second scattering particles 25*b* are commonly used in the art. In an embodiment, the shapes of the first scattering particles 25*a* and the second scattering particles 25*b* may be spherical, rod-shaped, plate-shaped, pyramidal, multi-arm, or cubic nanoparticles, nanotubes, nanowires, nanofibers, nanoplatelet particles, the like, or a combination thereof.

In an embodiment, the first scattering particles may be comprised in less than or equal to about 5 wt % of each of the banks. In an embodiment, the second scattering particles may be comprised in greater than or equal to about 10 wt % of each of the banks.

In the display apparatus according to an embodiment, a pigment may have a transmittance of greater than or equal to about 90% with respect to light having a wavelength of about 880 nm, and the pigment may absorb light in a wavelength range of about 350 nm to about 650 nm. Since the pigment having a transmittance of greater than or equal to about 90% with respect to light having a wavelength of about 880 nm is used, degradation in key recognition due to an inclusion of the pigment may not be caused. As a result, the formation of a bank having a fine structure while including a pigment may be realized.

In the display apparatus according to an embodiment, although there is no particular limitation on a color, the pigment may have a black color, a red color, a green color, a blue color, the like, or a combination thereof.

Also, in the display apparatus according to an embodiment, the pigment may not be carbon black. Since transmittance of carbon black with respect to light having a wavelength of about 880 nm is less than or equal to about 20%, key recognition may be degraded in case that the bank 210 includes carbon black.

In another embodiment, the bank 210 may include a first bank layer (not shown) including the first scattering particles 25*a* and the second scattering particles 25*b* and a second bank layer (not shown) formed directly contacting the first bank layer (not shown) and including a pigment. Accordingly, light transmittance of the first bank layer (not shown) may be greater than light transmittance of the second bank layer (not shown). The second bank layer (not shown) may be disposed closer to an organic light-emitting diode OLED than the first bank layer (not shown).

An optical density (OD) may be a value representing a degree in which a material having a thickness t1 of about 1 μm absorbs light and may satisfy Equation below.

$$OD = \log_{10}(1/T) \quad \text{[Equation]}$$

OD may be an optical density and T may be light transmittance.

For example, a high optical density (OD) of a material may mean that the material absorbs light well. In case that an optical density (OD) of a material is 0, light transmittance is 1, which means that the material may be transparent to light.

In general, in order to prevent color mixing between adjacent pixels, the optical density (OD) of a black matrix disposed between pixels may be greater than or equal to about 0.3/μm (per μm). For example, the optical density (OD) of a black matrix disposed between pixels may be greater than or equal to about 1.0/μm. Since a black matrix has to absorb light emitted from adjacent pixels, the bank may be required to include a material having a high optical density (OD).

However, since the bank 210 according to an embodiment include the first scattering particles 25*a* and the second scattering particles 25*b*, after light reaches the first scattering particles 25*a* and the second scattering particles 25*b* inside the bank 210, the light may be reused by being reflected and and/or scattered, and an optical density (OD) of the bank 210 of the embodiment may be lower than an optical density (OD) of a general black matrix.

Accordingly, in an embodiment, the optical density (OD) of the bank 210 may be in a range of about 0.01/μm to about 0.2/μm. In embodiments, a minimum width Wth of the bank 210 may be greater than or equal to about 10 μm. By using the first scattering particles 25*a* and the second scattering particles 25*b*, the bank 210 having the minimum width Wth of greater than or equal to about 10 μm may be formed.

In case that the optical density (OD) of the bank 210 is 0, for example, in case that the bank 210 is made of a transparent material, light emitted from the first color conversion layer QD1 may be incident on the second color conversion layer QD2, and color mixing may be caused. The bank 210 may have a certain optical density (OD) value. Accordingly, the bank 210 may have an optical density (OD) value of at least greater than or equal to about 0.01/μm. The minimum width Wth of the bank 210 may be greater than or equal to about 10 μm.

Even in case that the minimum width Wth of the bank 210 is greater than or equal to about 10 μm, light transmittance may be decreased, and light incident from the second color conversion layer QD2 may not reach the first color conversion layer QD1 and may be absorbed by the bank 210. Light incident from the organic light-emitting diode OLED of a second pixel P2 may also not reach the first color conversion layer QD1 of a first pixel P1 and may be absorbed by the bank 210. Accordingly, in case that the optical density (OD) of the bank 210 is greater than or equal to about 0.01/μm and the minimum width Wth is greater than or equal to about 10 μm, color mixing between adjacent pixels may be prevented.

Evaluation Example 1: Evaluation of Transmittance and Reflectance

Transmittance and reflectance of banks according to Examples and Comparative Example were evaluated. Characteristics of scattering particles included in each bank according to Examples and Comparative Example are shown in Table 1 below. Refractive indices ($n_0$) of polymer hosts included in Examples and Comparative Example were the same and were 1.55.

Wavelengths of light used for evaluation of transmittance were 365 nm and 880 nm. A wavelength of light used for evaluation of reflectance was 450 nm. Evaluation results are shown in Table 2 below. Based on transmittance and reflectance (100%) of Comparative Example 1, relative transmittance value (%) and relative reflectance value (%) of each Example were derived.

TABLE 1

| | | First scattering particles | | | Second scattering particles | | |
|---|---|---|---|---|---|---|---|
| | | Average diameter (nm) | Content (weight %) | Refractive index (n1) | Average diameter (nm) | Content (weight %) | Refractive index ($n_2$) |
| Example | 1 | 200 | 2 | 2.65 | 150 | 20 | 1.0 |
| | 2 | 70 | 1 | 2.65 | 150 | 30 | 1.0 |
| | 3 | 50 | 1 | 2.65 | 150 | 30 | 1.0 |
| | 4 | 50 | 2 | 2.65 | 150 | 30 | 1.0 |
| | 5 | 70 | 1 | 2.65 | 130 | 30 | 1.0 |
| | 6 | 50 | 1 | 2.65 | 130 | 30 | 1.0 |
| | 7 | 50 | 2 | 2.65 | 130 | 30 | 1.0 |
| | 8 | 220 | 1 | 2.65 | 140 | 30 | 1.0 |
| | 9 | 220 | 1 | 2.65 | 130 | 30 | 1.0 |
| | 10 | 300 | 1 | 2.65 | 130 | 30 | 1.0 |
| | 11 | 300 | 2 | 2.65 | 100 | 30 | 1.0 |
| | 12 | 170 | 1 | 2.65 | 100 | 30 | 1.0 |
| | 13 | 50 | 1 | 2.65 | 120 | 40 | 1.0 |
| | 14 | 50 | 1 | 2.65 | 100 | 40 | 1.0 |
| | 15 | 50 | 1 | 2.65 | 80 | 50 | 1.0 |
| | 16 | 170 | 1 | 2.65 | 70 | 50 | 1.0 |
| Comparative Example | 1 | 220 | 6 | 2.65 | — | — | — |

TABLE 2

| Evaluation target | | Transmittance (%) @ 365 nm | Transmittance (%) @ 880 nm | Reflectance (%) @ 450 nm |
|---|---|---|---|---|
| Example | 1 | 113.0 | 101.1 | 103.4 |
| | 2 | 127.7 | 101.1 | 108.8 |
| | 3 | 159.0 | 101.3 | 107.2 |
| | 4 | 110.2 | 100.7 | 108.7 |
| | 5 | 138.4 | 114.7 | 104.9 |
| | 6 | 173.0 | 115.0 | 103.3 |
| | 7 | 120.2 | 114.5 | 104.7 |
| | 8 | 103.9 | 98.8 | 113.9 |
| | 9 | 111.8 | 105.0 | 111.5 |
| | 10 | 142.5 | 99.9 | 110.8 |
| | 11 | 131.2 | 100.9 | 107.3 |
| | 12 | 130.4 | 128.7 | 100.2 |

TABLE 2-continued

| Evaluation target | | Transmittance (%) @ 365 nm | Transmittance (%) @ 880 nm | Reflectance (%) @ 450 nm |
|---|---|---|---|---|
| | 13 | 98.5 | 108.1 | 119.6 |
| | 14 | 136.2 | 125.4 | 107.6 |
| | 15 | 135.9 | 133.8 | 104.2 |
| | 16 | 96.4 | 133.4 | 102.9 |
| Comparative Example | 1 | 100 | 100 | 100 |

Referring to Table 2, in the bank according to each Example, it can be confirmed that transmittance with respect to light having a wavelength of 365 nm and/or light having a wavelength of 880 nm is increased, and reflectance with respect to light having a wavelength of 450 nm is increased as compared with the bank according to Comparative Example.

As a result, the banks according to Examples may have a more dense and precise structure, the visibility of the banks may be further suppressed, and the light efficiency of a display apparatus including the bank may be improved.

Embodiments of the disclosure have been described. Such embodiments may be implemented as separate embodiments or may be combined with each other.

As described above, a bank 210 included in a display apparatus according to embodiments may include first scattering particles 25*a* and second scattering particles 25*b* having a refractive index different from a refractive index of the first scattering particles. As a result, the visibility of the bank 210 may be suppressed, and the light efficiency of the display apparatus can be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:

a plurality of light-emitting devices disposed on a substrate;

a plurality of color conversion layers disposed on the substrate and corresponding to the plurality of light-emitting devices; and a plurality of banks disposed between adjacent ones of the plurality of color conversion layers, wherein each of the plurality of banks includes first scattering particles, second scattering particles, and a polymer host, a refractive index ($n_1$) of the first scattering particles is greater than a refractive index ($n_0$) of the polymer host, and the refractive index ($n_1$) of the first scattering particles and a refractive index ($n_2$) of the second scattering particles are different.

2. The display apparatus of claim 1, wherein the refractive index ($n_1$) of the first scattering particles and the refractive index ($n_0$) of the polymer host satisfy Condition 1 below:

$$|n_1 - n_0| > 0.8. \quad \text{[Condition 1]}$$

3. The display apparatus of claim 1, wherein the refractive index ($n_2$) of the second scattering particles is less than the refractive index ($n_0$) of the polymer host.

4. The display apparatus of claim 1, wherein the refractive index ($n_2$) of the second scattering particles is less than or equal to about 1.0.

5. The display apparatus of claim 1, wherein the refractive index ($n_2$) of the second scattering particles and the refractive index ($n_0$) of the polymer host satisfy Condition 2 below:

$$|n_2 - n_0| \leq 0.6. \quad \text{[Condition 2]}$$

6. The display apparatus of claim 1, wherein the first scattering particles are comprised in less than or equal to about 5 wt % of each of the plurality of banks.

7. The display apparatus of claim 1, wherein the second scattering particles are comprised in greater than or equal to about 10 wt % of each of the plurality of banks.

8. The display apparatus of claim 1, wherein an average diameter of the first scattering particles is in a range of about 50 nm to about 300 nm.

9. The display apparatus of claim 1, wherein an average diameter of the second scattering particles is in a range of about 50 nm to about 170 nm.

10. The display apparatus of claim 1, wherein each of the plurality of banks is formed of a single layer.

11. The display apparatus of claim 1, wherein the first scattering particles include $TiO_2$.

12. The display apparatus of claim 1, wherein the second scattering particles include $SiO_2$.

13. The display apparatus of claim 1, wherein the second scattering particles are hollow particles.

14. The display apparatus of claim 1, wherein each of the second scattering particles comprises a core and a shell.

15. The display apparatus of claim 14, wherein a refractive index ($n_3$) of the shell is in a range of about 1.45 to about 1.55.

16. The display apparatus of claim 14, wherein a refractive index ($n_3$) of the shell and the refractive index ($n_0$) of the polymer host satisfy Condition 3 below:

$$|n_3 - n_0| < 0.1. \quad \text{[Condition 3]}$$

17. The display apparatus of claim 1, wherein each of the plurality of banks further includes a pigment.

18. The display apparatus of claim 17, wherein the pigment has a black color.

19. The display apparatus of claim 1, wherein each of the plurality of banks comprises:

a first bank layer including the first scattering particles and the second scattering particles; and a second bank layer directly contacting a surface of the first bank layer and including a pigment.

20. The display apparatus of claim 1, wherein at least one of the plurality of light-emitting devices comprises a light source that emits blue light.

* * * * *